(12) United States Patent
Qiao et al.

(10) Patent No.: US 11,003,015 B1
(45) Date of Patent: May 11, 2021

(54) ELECTRONIC DEVICE WITH A LIGHT GUIDING LAYER

(71) Applicant: Apple Inc., Cupertino, CA (US)

(72) Inventors: Yi Qiao, San Jose, CA (US); Jean-Pierre S Guillou, Los Gatos, CA (US); Michael J. Brown, Campbell, CA (US); Ming Xu, Cupertino, CA (US); Tyler R. Kakuda, Stockton, CA (US)

(73) Assignee: Apple Inc., Cupertino, CA (US)

( * ) Notice: Subject to any disclaimer, the term of this patent is extended or adjusted under 35 U.S.C. 154(b) by 15 days.

(21) Appl. No.: 16/285,419

(22) Filed: Feb. 26, 2019

Related U.S. Application Data (60) Provisional application No. 62/638,806, filed on Mar. 5, 2018.

(51) Int. Cl.
| | |
|---|---|
| *F21V 8/00* | (2006.01) |
| *G02B 6/08* | (2006.01) |
| *G02F 1/1333* | (2006.01) |
| *G02F 1/1335* | (2006.01) |
| *H01L 27/32* | (2006.01) |
| *H01L 33/44* | (2010.01) |
| *H01L 33/58* | (2010.01) |

(Continued)

(52) U.S. Cl.
CPC ..... *G02F 1/133524* (2013.01); *G02B 6/0078* (2013.01); *G02B 6/08* (2013.01); *G02F 1/13336* (2013.01); *G02F 1/133528* (2013.01); *H01L 27/156* (2013.01); *H01L 27/3293* (2013.01); *H01L 33/44* (2013.01); *H01L 33/58* (2013.01); *H01L 51/5281* (2013.01)

(58) Field of Classification Search
CPC .......... G02F 1/133524; G02F 1/13336; G02F 1/133528; G02F 1/133526; G02F 1/133606; H01L 51/5281; H01L 33/44; H01L 33/58; H01L 27/3293; H01L 27/156
See application file for complete search history.

(56) References Cited

U.S. PATENT DOCUMENTS

| | | | |
|---|---|---|---|
| 28,341 | A | 5/1860 | Bennett |
| 4,349,817 | A | 9/1982 | Hoffman et al. |

(Continued)

FOREIGN PATENT DOCUMENTS

KR    20180034832 A    4/2018

*Primary Examiner* — Ryan A Lepisto
*Assistant Examiner* — Erin D Chiem
(74) *Attorney, Agent, or Firm* — Treyz Law Group, P.C.; Joseph F. Guihan (57) ABSTRACT

A light guiding layer may be incorporated into an electronic device with multiple displays to create a seamless display surface between the adjacent displays. The light guiding layer may have a first portion that overlaps the active area of a first display panel, a second portion that overlaps the active area of a second, adjacent display panel, and a third portion that overlaps the inactive areas of the first and second display panels. The light guiding layer may redirect light from the active area of each display panel to the region above the inactive areas of the display panels where it is emitted towards the viewer. The light guiding layer therefore effectively hides the border between the two display panels by emitting light in that region. The light guiding layer may include light leakage promotion structures to ensure light is emitted in the border region.

18 Claims, 7 Drawing Sheets

(51) Int. Cl.
  *H01L 27/15* (2006.01)
  *H01L 51/52* (2006.01)

(56) References Cited

U.S. PATENT DOCUMENTS

| | | | |
|---|---|---|---|
| 4,534,813 A | 8/1985 | Williamson et al. | |
| 5,329,386 A | 7/1994 | Birecki et al. | |
| 5,502,457 A | 3/1996 | Sakai et al. | |
| 5,659,378 A | 8/1997 | Gessel | |
| 6,046,730 A | 4/2000 | Bowen et al. | |
| 6,407,785 B1 | 6/2002 | Yamazaki | |
| 6,467,922 B1 | 10/2002 | Blanc et al. | |
| 6,680,761 B1 | 1/2004 | Greene et al. | |
| 6,845,190 B1 | 1/2005 | Smithwick et al. | |
| 7,228,051 B2 | 6/2007 | Cok et al. | |
| 7,510,308 B2 * | 3/2009 | Goto | G02B 3/0056 362/330 |
| 7,542,209 B2 | 6/2009 | McGuire, Jr. | |
| 7,823,309 B2 | 11/2010 | Albenda | |
| 7,856,161 B2 | 12/2010 | Tabor | |
| 7,929,211 B2 * | 4/2011 | Chuang | G02B 5/0278 359/619 |
| 8,045,270 B2 | 10/2011 | Shin et al. | |
| 8,723,824 B2 | 5/2014 | Myers et al. | |
| 8,824,779 B1 | 9/2014 | Smyth | |
| 8,976,324 B2 | 3/2015 | Yang et al. | |
| 9,268,068 B2 | 2/2016 | Lee | |
| 9,312,517 B2 | 4/2016 | Drzaic et al. | |
| 9,342,105 B2 | 5/2016 | Choi et al. | |
| 9,509,939 B2 | 11/2016 | Henion et al. | |
| 9,591,765 B2 | 3/2017 | Kim et al. | |
| 9,755,004 B2 | 9/2017 | Shieh et al. | |
| 9,818,725 B2 | 11/2017 | Bower et al. | |
| 9,907,193 B2 | 2/2018 | Lee et al. | |
| 10,048,532 B2 | 8/2018 | Powell et al. | |
| 10,052,831 B2 | 8/2018 | Welker et al. | |
| 10,416,950 B2 * | 9/2019 | Kim | G02B 3/0037 |
| 10,660,220 B2 * | 5/2020 | Chin | G02B 6/00 |
| 2006/0016448 A1 | 1/2006 | Ho | |
| 2007/0097108 A1 | 5/2007 | Brewer | |
| 2008/0144174 A1 | 6/2008 | Lucente et al. | |
| 2008/0186252 A1 | 8/2008 | Li | |
| 2008/0285310 A1 * | 11/2008 | Aylward | G02B 6/0068 362/626 |
| 2010/0177261 A1 | 7/2010 | Jin et al. | |
| 2010/0238090 A1 | 9/2010 | Pomerantz et al. | |
| 2011/0025594 A1 | 2/2011 | Watanabe | |
| 2011/0057861 A1 | 3/2011 | Cok et al. | |
| 2011/0102300 A1 | 5/2011 | Wood et al. | |
| 2011/0242686 A1 | 10/2011 | Watanabe | |
| 2012/0218219 A1 | 8/2012 | Rappoport et al. | |
| 2013/0081756 A1 | 4/2013 | Franklin et al. | |
| 2013/0083080 A1 | 4/2013 | Rappoport et al. | |
| 2013/0235560 A1 | 9/2013 | Etienne et al. | |
| 2013/0279088 A1 | 10/2013 | Raff et al. | |
| 2014/0037257 A1 | 2/2014 | Yang et al. | |
| 2014/0092028 A1 | 4/2014 | Prest et al. | |
| 2014/0092346 A1 | 4/2014 | Yang et al. | |
| 2014/0183473 A1 | 7/2014 | Lee et al. | |
| 2014/0240985 A1 | 8/2014 | Kim et al. | |
| 2014/0328041 A1 | 11/2014 | Rothkopf et al. | |
| 2014/0354920 A1 | 12/2014 | Jang et al. | |
| 2015/0093087 A1 | 4/2015 | Wu | |
| 2015/0227227 A1 | 8/2015 | Myers et al. | |
| 2016/0231784 A1 | 8/2016 | Yu et al. | |
| 2016/0234362 A1 | 8/2016 | Moon et al. | |
| 2017/0032763 A1 * | 2/2017 | Cheong | G02F 1/133305 |
| 2017/0235341 A1 | 8/2017 | Huitema et al. | |
| 2018/0052312 A1 | 2/2018 | Jia et al. | |
| 2018/0088416 A1 | 3/2018 | Jiang et al. | |
| 2018/0372958 A1 | 12/2018 | Karafin et al. | |

* cited by examiner

ELECTRONIC DEVICE WITH A LIGHT GUIDING LAYER

This application claims priority to U.S. provisional patent application No. 62/638,806 filed on Mar. 5, 2018, which is hereby incorporated by reference herein in its entirety.

FIELD

This relates to electronic devices, and, more particularly, to electronic devices with displays.

BACKGROUND

Electronic devices such as laptop computers, cellular telephones, and other equipment may include displays. Displays in electronic devices may have an active area that is surrounded by an inactive area. The active area may include pixels that emit light that is viewable by a user, whereas the inactive area does not emit light that is viewable by a user. Some electronic devices may include more than one display.

If care is not taken, electronic devices with multiple displays may have undesirable seams between the displays. For example, the inactive area of the displays may result in a portion between the displays that does not emit light that is viewable by the user.

SUMMARY

An electronic device may be provided with more than one display in a housing. Each display may have an array of pixels that form an active area for displaying images. Each display may have an inactive area containing circuitry such as display driver circuitry or gate driver circuitry that surrounds the active area. Adjacent displays in the electronic device may therefore have a border region between them that cannot display images.

To create a seamless display surface between the adjacent displays, a light guiding layer may be provided. The light guiding layer may have a first portion that overlaps the active area of a first display panel, a second portion that overlaps the active area of a second, adjacent display panel, and a third portion that overlaps the inactive areas of the first and second display panels. The light guiding layer may redirect light from the active area of each display panel to the region above the inactive areas of the display panels where it is emitted towards the viewer. The light guiding layer therefore effectively hides the border between the two display panels (by emitting light in that region).

The light guiding layer may include light leakage promotion structures to ensure light is emitted in the border region. For example, the light guiding layer may have lenticular ridges on an upper surface that cause light to be emitted upon reaching the upper surface of the light guiding layer. Additionally, the light guiding layer may have recesses on a lower surface that redirect light towards the light leakage promotion structures on the upper surface.

The light guiding layer may be used to hide a border region between adjacent displays that are coplanar. Alternatively, the light guiding layer may be used to hide a border region between adjacent displays that are at an angle (e.g., 90-degree angle) relative to each other.

DETAILED DESCRIPTION

Electronic devices can be provided with one or more displays. The displays may, if desired, be positioned adjacent to each other in the electronic device. Each display may have an inactive area that extends around at least a portion of the border of the display. Therefore, when two displays are positioned next to each other, the inactive area of the displays may be positioned between the two displays. This inactive area between the displays does not include pixels that emit light and may be referred to as a seam between the two displays. To enable light to be displayed from the seam between the two displays, a light guiding layer may be provided. The light guiding layer may take light from the active areas of the adjacent displays and emit the light, effectively hiding the seam between the two displays.

Figure 1:
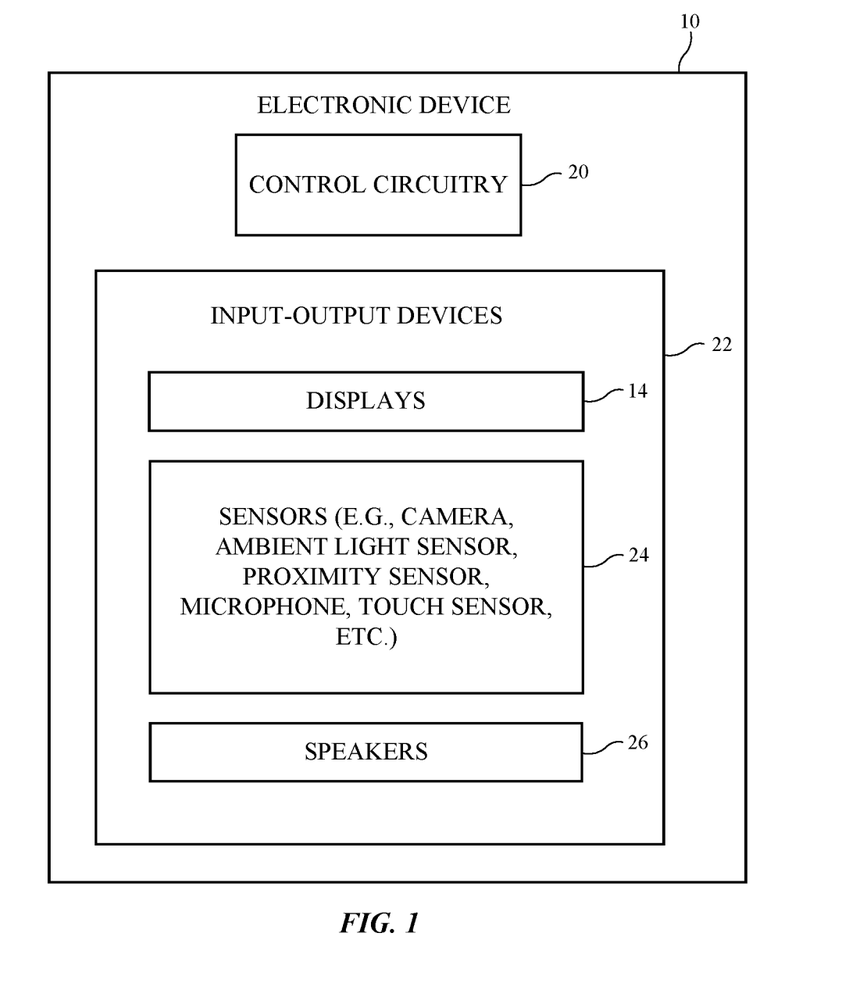
FIG. 1 is a schematic diagram of an illustrative electronic device in accordance with an embodiment.

An illustrative electronic device of the type that may be provided with multiple displays is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. Illustrative configurations in which electronic device 10 is a portable electronic device may sometimes be described herein as an example. This is, however, merely illustrative. Electronic device 10 may be any suitable electronic equipment.

As shown in FIG. 1, electronic device 10 may have control circuitry 20. Control circuitry 20 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 20 may be used to control the operation of device 10. The processing circuitry may be based on one or more microprocessors, microcontrollers, digital signal processors, baseband processors, power management units, audio chips, application specific integrated circuits, etc.

Control circuitry 20 may include wired and/or wireless communications circuitry. The wireless communications circuitry of circuitry 20 may include one or more antennas and one or more radio-frequency transceiver circuits (e.g., a cellular telephone transceiver, a wireless local area network transceiver, etc.).

Input-output circuitry in device 10 such as input-output devices 22 may be used to allow data to be supplied to device 10 and to allow data to be provided from device 10 to external devices. Input-output devices 22 may include buttons, joysticks, scrolling wheels, key pads, keyboards, tone generators, haptic output devices such as vibrators, light-emitting diodes and other status indicators, data ports, etc. Input-output devices 22 may also include sensors 24. Audio output (sound) may be provided using one or more speakers such as speakers 26.

Input-output devices 12 may include one or more displays 14. Each display may be a touch screen display that includes a touch sensor for gathering touch input from a user or each display may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Sensors 24 may include touch sensors (e.g., capacitive touch sensors formed from arrays of capacitive touch sensor electrodes that overlap one or more of displays 14 and/or that are formed elsewhere in device 10), microphones for gathering ambient noise measurements and voice commands, a magnetic sensor (e.g., a compass), an accelerometer, a gyroscope, a force sensor (e.g., a two-dimensional force sensor which may optionally overlap a touch sensor and/or display 14), a temperature sensor, a pressure sensor, a compass, etc. Sensors 24 may also include light-based sensors such as a light-based proximity sensor (e.g., an optical proximity sensor having an infrared light-emitting diode that emits light and having a corresponding infrared light detector for measuring the infrared light after the infrared light has reflected from an external object), an ambient light sensor (e.g., a color-sensitive ambient light sensor that can measure ambient light color and intensity), and a camera (e.g., a digital image sensor) for capturing images, and/or other image sensing and/or light-detecting devices. Input-output devices 22 may also include light-emitting diodes (e.g., status indicator lights, a camera flash, etc.) and/or other light-emitting devices. Light-based (optical) components such as these (e.g., light-emitting device and/or light-based sensors) may be mounted under transparent window regions (e.g., a transparent window in a portion of display 14, a transparent window in a device housing, etc.).

Figure 2:
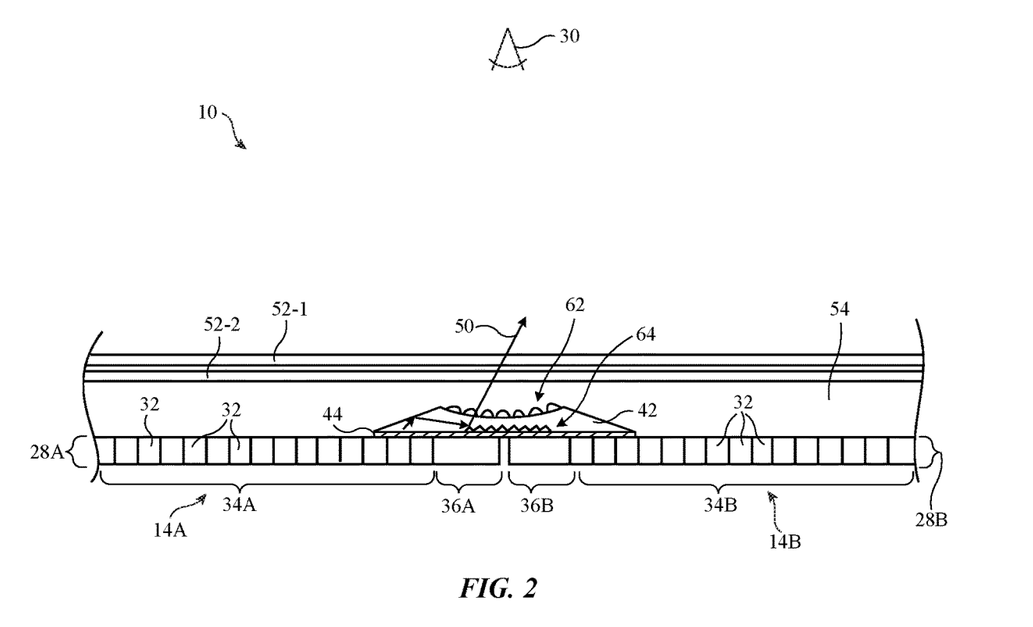
FIG. 2 is a cross-sectional side view of an illustrative electronic device having two adjacent displays and a light guiding layer to hide the border region between the two adjacent displays in accordance with an embodiment.

A cross-sectional side view of an illustrative electronic device including multiple displays is shown in FIG. 2. As shown in FIG. 2, electronic device 10 includes a first display 14A and a second display 14B. The first display includes a display panel 28A having display pixels 32 in a corresponding active area 34A. Display pixels 32 in active area 34A may generate light that is emitted towards viewer 30. The active area of display 14A may be surrounded by a corresponding inactive area 36A. Inactive area 36A may include display circuitry (e.g., gate driver circuitry, display driver circuitry, etc.). However, inactive area 36A does not include pixels. The second display (14B) also includes a display panel 28B having display pixels 32 in a corresponding active area 34B. Display pixels 32 in active area 34B may generate light that is emitted towards viewer 30. The active area of display 14B may be surrounded by a corresponding inactive area 36B. Inactive area 36B may include display circuitry (e.g., gate driver circuitry, display driver circuitry, etc.). However, inactive area 36B does not include pixels. The inactive areas 36A and 36B may collectively be referred to as a single inactive area, inactive region, or border region.

Pixels 32 may be formed from liquid crystal display (LCD) components, organic light-emitting diode structures, plasma display structures, electrowetting display structures, electrophoretic display structures, or other desired display pixel structures. Each respective display in electronic device 10 may have any desired type of display pixels (e.g., the displays may have display pixels of the same types or display pixels of different types).

As previously discussed, inactive area 36A of display panel 28A and inactive area 36B of display panel 28B do not include display pixels and therefore do not emit light towards viewer 30. However, it may be desirable for light to be emitted in this region, thereby forming a seamless display surface (including displays 14A and 14B) despite the presence of the inactive region between the display active areas. Electronic device 10 may therefore include light guiding layer 42 to guide light from the edge of the active areas of the displays to the inactive region between the displays.

As shown in FIG. 2, light guiding layer 42 may be attached to the upper surface of display panels 28A and 28B. In the embodiment shown, light guiding layer 42 is attached to the upper surface of the display panels using adhesive 44. Adhesive 44 may be transparent (e.g., an optically clear adhesive).

As shown, light guiding layer 42 may overlap the active areas of displays 14A and 14B. A first portion of the light guiding layer overlaps (and is attached to) active area 34A of display panel 28A. A second portion of the light guiding layer overlaps (and is attached to) active area 34B of display panel 28B. A third portion of the light guiding layer (that is interposed between the first and second portions) overlaps (and is attached to) the inactive area 36A of display panel 28A and the inactive area 36B of display panel 28B. Light may enter light guiding layer 42 from active area 34A and active area 34B. Consider light 50 that is emitted from a pixel in active area 34A. The light may be emitted from the pixel and pass into the light guiding layer. Light 50 may be reflected off of surfaces of the light guiding layer (e.g., in the positive X-direction) and travel towards the border region between the two active areas. Then, light leakage promotion structures may cause light 50 to exit the light guiding layer (in a direction towards viewer 30). In this way, light from the edge of the active areas may be redirected and emitted from the border region between the display active areas. This can ensure a seamless display surface with display light emitted across the entire display surface.

Display panels 28A and 28B may be covered by one or more transparent layers. FIG. 2 shows an example where transparent layers 52-1 and 52-2 cover display panels 28A and 28B as well as light guiding layer 42. Transparent layers 52-1 and 52-2 may be any desired layers. For example, each transparent layer may be a polarizer layer, a color filter layer, a dielectric cover layer, a touch sensor layer, or another desired display layer. In the example of FIG. 2, transparent layer 52-2 may be a polarizer layer and transparent layer 52-1 may be a dielectric cover layer. For example, polarizer layer 52-2 may be a polarizer (e.g., a linear polarizer) that serves as an upper polarizer for a liquid crystal display (e.g., pixels 32 may be liquid crystal display pixels). In another example, polarizer layer 52-2 may be a polarizer (e.g., a linear polarizer) that serves as a portion of a circular polarizer for a light-emitting diode display (e.g., pixels 32 may be light-emitting diode display pixels). Dielectric cover layer 52-1 may serve as an exterior layer for the electronic device. The dielectric cover layer may be formed from glass and may sometimes be referred to as a cover glass or a cover glass layer.

The space between transparent layer 52-2 (e.g., the layer above light guiding layer 42) and display panels 28A and 28B may be filled with any desired material 54. In one illustrative embodiment, the space between transparent layer 52-2 and display panels 28A and 28B may be filled with air (e.g., an air-gap). In another illustrative embodiment, optically clear adhesive (OCA) 54 may fill the gap between the display panels and the transparent layer. This example is merely illustrative. In general, any desired transparent material 54 (sometimes referred to as transparent filler) may fill this space.

Material 54 may have a lower index of refraction than light guiding layer 42. Light guiding layer 42 may be formed from a material with a high index of refraction. For example, light guiding layer 42 may be formed from glass, polycarbonate, or another desired transparent polymer. Light guiding layer 42 may have an index of refraction that is greater than 1.5, greater than 1.3, greater than 1.1, greater than 1.7, less than 2.0, less than 1.5, less than 1.7, between 1.3 and 2.0, between 1.3 and 1.7, or another desired index of refraction. In contrast, material 54 that surrounds light guiding layer 42 may have an index of refraction that is less than 1.1, less than 1.2, less than 1.3, less than 1.4, less than 1.5, greater than 1.0, greater than 1.2, between 1.0 and 1.3, or another desired index of refraction. The index of refraction of light guiding layer 42 may be greater than the index of refraction of material 54. The difference between the indices of refraction may be greater than 0.2, greater than 0.3, greater than 0.4, greater than 0.5, less than 0.5, between 0.2 and 0.7, or any other desired difference.

The example of FIG. 2 where light guiding layer 42 is attached to the display panels with adhesive is merely illustrative. Light guiding layer 42 may additionally or instead have adhesive attaching the light guiding layer to transparent layer 52-2. Any desired arrangement may be used to incorporate light guiding layer 42 into the electronic device.

Light guiding layer 42 may include light leakage promotion structures to increase the amount of light that is emitted in the border region between the two displays. As shown in FIG. 2, light guiding layer 42 includes a first plurality of light leakage promotion structures 62 on the upper surface of the light guiding layer and a second plurality of light redirecting structures (sometimes also referred to as light leakage promotion structures) 64 on the lower surface of the light guiding layer. These light leakage promotion structures may include protrusions and/or recesses of any desired shapes to help light ultimately exit the light guiding layer over inactive areas 34A and 34B. The light leakage promotion structures are shown in more detail in FIG. 3.

Figure 3:
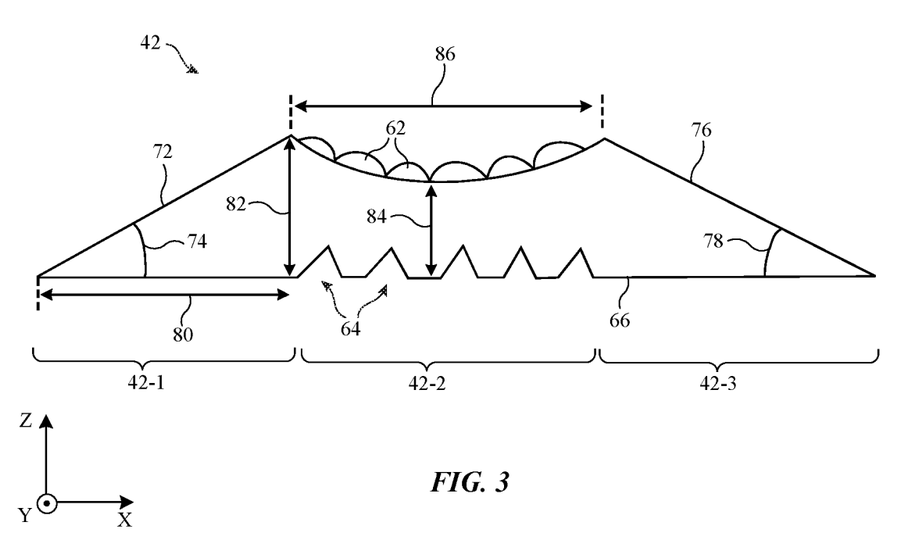
FIG. 3 is a cross-sectional side view of an illustrative light guiding layer of the type shown in FIG. 2 in accordance with an embodiment.

FIG. 3 is a cross-sectional side view of an illustrative light guiding layer of the type that may be included in FIG. 2. As shown, light guiding layer 42 includes a first portion 42-1, a second portion 42-2, and a third portion 42-3. Portions 42-1 and 42-3 may be referred to as wedge portions. Portions 42-1 and 42-3 may overlap the active areas of respective displays. Portion 42-2 is interposed between portions 42-1 and 42-3 and may be referred to as a light leakage region. Portion 42-2 overlaps the inactive region between the displays and includes light leakage promotion structures to ensure sufficient emission of light over the inactive region.

Wedge portion 42-1 has a planar upper surface 72 that is at an angle 74 relative to planar lower surface 66. Light may be emitted from the active area of a display through lower surface 66 into wedge portion 42-1. Some of the light (e.g., on-axis light) may be transmitted through surface 72. However, some of the light (e.g., off-axis light) may be reflected off of surface 72 due to total internal reflection (TIR). Angle 74 may be any desired angle and may be selected to control how much light is reflected towards portion 42-2.

Similarly, wedge portion 42-3 has a planar upper surface 76 that is at an angle 78 relative to planar lower surface 66. Light may be emitted from the active area of a display through lower surface 66 into wedge portion 42-3. Some of the light (e.g., on-axis light) may be transmitted through surface 76. However, some of the light (e.g., off-axis light) may be reflected off of surface 76 due to total internal reflection (TIR). Angle 78 may be any desired angle and may be selected to control how much light is reflected towards portion 42-2.

Wedge portion 42-1 may have any desired width 80. Width 80 may correspond to the amount of light guiding layer 42 that overlaps the active area of a first display (e.g., active area 34A in FIG. 2). Width 80 may be between 1 millimeters and 2 millimeters, greater than 0.5 millimeters, greater than 1 millimeter, greater than 2 millimeters, greater than 0.1 millimeters, greater than 10 millimeters, less than 0.5 millimeters, less than 1 millimeter, less than 2 millimeters, less than 0.1 millimeters, less than 10 millimeters, about (e.g., within 10% of) 1.6 millimeters, etc. Wedge portion 42-3 may have the same width as wedge portion 42-1 or a different width than wedge portion 42-1.

Wedge portion 42-1 may have a height (thickness) 82. Height 82 may correspond to the height of the thickest portion of the light guiding layer. Height 82 may be between 0.1 millimeters and 1.0 millimeters, greater than 0.1 millimeters, greater than 0.2 millimeter, greater than 0.5 millimeters, greater than 0.01 millimeters, greater than 1.0 millimeter, greater than 10 millimeters, less than 0.1 millimeters, less than 0.2 millimeter, less than 0.5 millimeters, less than 0.01 millimeters, less than 1.0 millimeter, less than 10 millimeters, about (e.g., within 10% of) 0.3 millimeters, etc. Wedge portion 42-3 may the same height as wedge portion 42-1 or a different height than wedge portion 42-1.

Light leakage portion 42-2 of light guiding layer 42 has a width 86. Width 86 may correspond to the distance between the active areas of the adjacent displays (e.g., the width of the border region). Width 86 may be between 1 millimeters and 5 millimeters, between 3 and 4 millimeters, greater than 1 millimeter, greater than 2 millimeters, greater than 3 millimeters, greater than 5 millimeters, greater than 10 millimeters, less than 1 millimeter, less than 2 millimeters, less than 3 millimeters, less than 5 millimeters, less than 10 millimeters, about (e.g., within 10% of) 3.2 millimeters, etc.

Light guiding layer may have a height (thickness) 84 at the center of the light guiding layer (e.g., at the center of portion 42-2). The light guiding layer may be thinned in the center of the light guiding layer to control light leakage. For example, if light guiding layer 42 covers two adjacent and coplanar displays, the light guiding layer may be thinned to increase light leakage over the inactive region between the displays. Height 84 may therefore be less than height 82. Height 84 may be may be between 0.05 millimeters and 0.2 millimeters, greater than 0.05 millimeters, greater than 0.1 millimeter, greater than 0.2 millimeters, greater than 0.5 millimeters, greater than 0.01 millimeters, greater than 1.0 millimeter, greater than 10 millimeters, less than 0.05 millimeters, less than 0.1 millimeters, less than 0.2 millimeter, less than 0.5 millimeters, less than 0.01 millimeters, less than 1.0 millimeter, less than 10 millimeters, about (e.g., within 10% of) 0.1 millimeters, etc. Heights 82 and 84 may differ by a factor of greater than 1, greater than 2, greater than 1.5, greater than 2.5, greater than 3, or another desired factor.

Light guiding layer 42 also includes light leakage promotion structures. First, light guiding layer 42 has light leakage promotion structures 62 on an upper surface of the light guiding layer. In particular, the light leakage promotion structures are formed on the upper surface of portion 42-2 of the light guiding layer. The light leakage promotion structures may be formed from the same material as the rest of the light guiding layer or a different material than the rest of the light guiding layer. Light leakage promotion structures 62 may be lenticular lenses, microlenses, or other structures that promote light leakage in portion 42-2. It is desirable for light to exit light guiding layer 42 in portion 42-2 (so that the light is emitted from the border region). Without structures 62, light might reflect off of the upper surface of the light guiding layer in portion 42-2 (due to total internal reflection) and not exit the light guiding layer in portion 42-2. The presence of structures 62 may cause light that reaches the upper surface of portion 42-2 to exit the light guiding layer.

Light guiding layer 42 also has light leakage promotion structures 64 on a lower surface of the light guiding layer. Light leakage promotion structures 64 may be recesses in the lower surface of the light guiding layer that form a turning film. Light leakage promotion structures 64 may reflect light that reaches the lower surface of portion 42-2 towards the upper surface of portion 42-2 (increasing the likelihood of the light exiting light guiding layer 42 in portion 42-2).

In general, structures 62 and 64 may be any desired structures. In one possible embodiment, light leakage promotion structures 62 may be formed by lenticular lenses that extend along the length of the light guiding layer.

Figure 4:
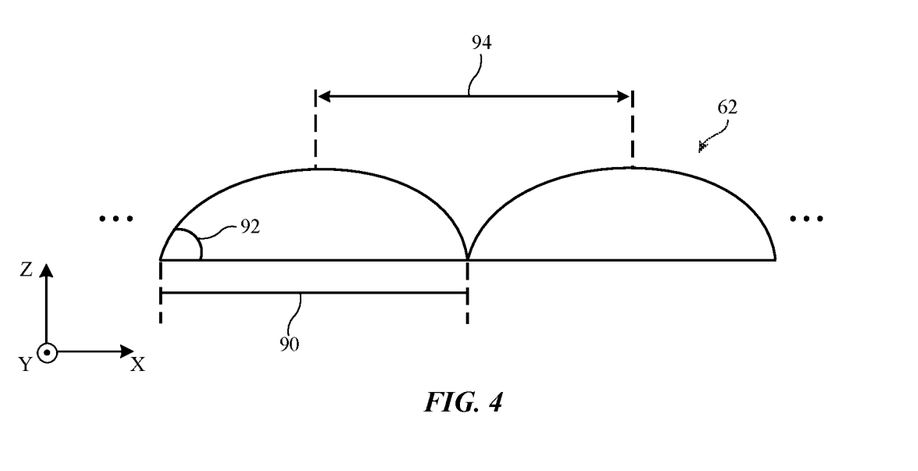
FIG. 4 is a cross-sectional side view of illustrative light leakage promotion structures that may be incorporated on an upper surface of a light guiding layer such as the light guiding layer of FIG. 3 in accordance with an embodiment.

FIG. 4 is a cross-sectional side view showing lenticular lenses 62 (sometimes referred to as lenticular ridges 62). As shown in FIG. 4, lenticular ridges 62 may have a semicircular cross-sectional shape. This example is merely illustrative, however. In general, the cross-section of ridges 62 may have any desired shape. Each ridge may extend along a longitudinal axis along the length of the light guiding layer (e.g., into or out of the page in FIG. 4, parallel to the Y-axis). Each ridge may have a base width 90. The base width may be between 25 microns and 75 microns, between 20 microns and 100 microns, greater than 10 microns, greater than 30 microns, greater than 50 microns, greater than 80 microns, greater than 100 microns, greater than 1000 microns, less than 10 microns, less than 30 microns, less than 50 microns, less than 80 microns, less than 100 microns, less than 1000 microns, about (e.g., within 10% of) 50 microns, etc. Similarly, the ridges may have any desired spacing 94 (e.g., between 25 microns and 75 microns, between 20 microns and 100 microns, greater than 10 microns, greater than 30 microns, greater than 50 microns, greater than 80 microns, greater than 100 microns, greater than 1000 microns, less than 10 microns, less than 30 microns, less than 50 microns, less than 80 microns, less than 100 microns, less than 1000 microns, about 50 microns, etc.) and angle 92 of the curved upper surface of the ridge relative to the X-axis (e.g., between 40 degrees and 50 degrees, between 15 degrees and 30 degrees, between 10 degrees and 50 degrees, more than 10 degrees, more than 20 degrees, more than 45 degrees, more than 65 degrees, less than 10 degrees, less than 20 degrees, less than 45 degrees, less than 65 degrees, about 20 degrees, etc.). The dimensions and spacing of each ridge 62 may be the same across the light guiding layer or may vary across the light guiding layer.

Figure 5:
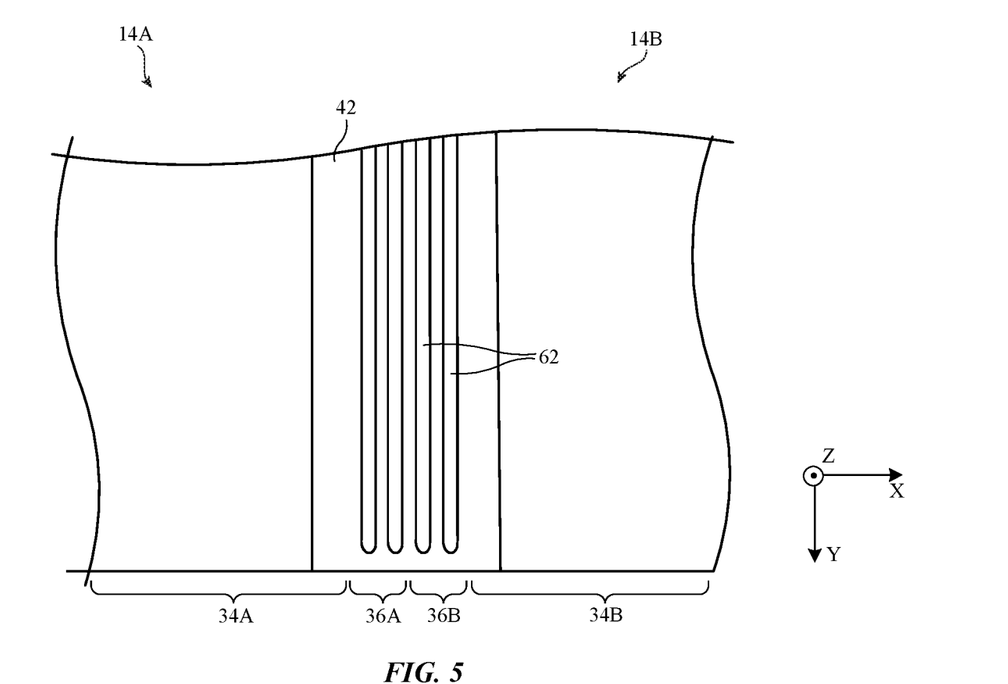
FIG. 5 is a top view of illustrative light leakage promotion structures for a light guiding layer that extend along a longitudinal axis such as the light leakage promotion structures of FIG. 4 in accordance with an embodiment.

FIG. 5 is a top view of light spreading layer 42 showing how lenticular ridges 62 extend parallel to the Y-axis. As shown, light spreading layer 42 overlaps active area 34A and inactive area 36A of display 14A as well as active area 34B and inactive area 36B of display 14B. The border region formed by inactive areas 36A and 36B extends between the displays along the Y-axis. Light leakage promotion structures 62 may also extend parallel to the Y-axis.

Figure 6:
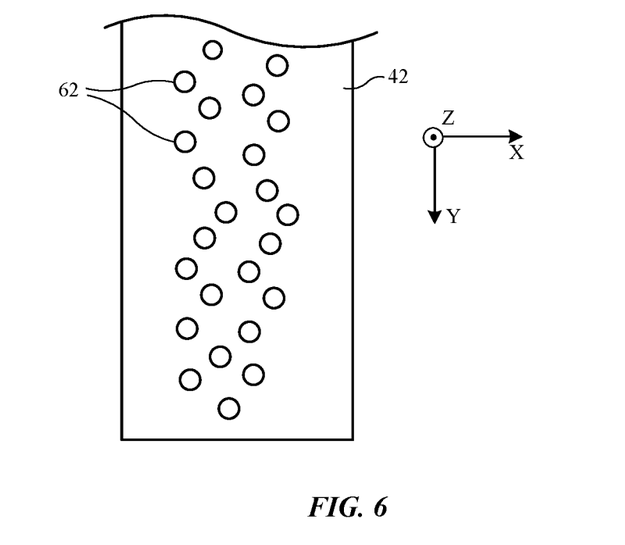
FIG. 6 is a top view of illustrative light leakage promotion structures for a light guiding layer that are formed as dots on the light leakage layer in accordance with an embodiment.

The example in FIG. 5 of light leakage promotion structures 62 being lenticular ridges that extend along a longitudinal axis is merely illustrative. Other structures may be used for light leakage promotion structures if desired. For example, FIG. 6 is a top view of a light spreading layer 42 having light leakage promotion dots 62. Each extraction dot 62 (sometimes referred to as a microlens) may have any desired cross-section (e.g., the same cross-section shown in FIG. 4, for example). The lenticular ridges of FIG. 5 may spread light relative to one axis, whereas the extraction dots of FIG. 6 may spread light relative to two axes. The extraction dots may have any desired outline or shape.

Figure 7:
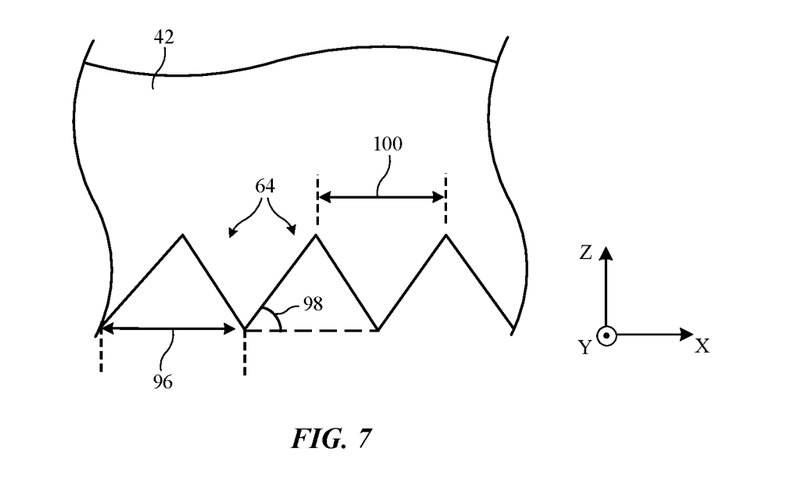
FIG. 7 is a cross-sectional side view of illustrative light leakage promotion structures that may be incorporated on a lower surface of a light guiding layer such as the light guiding layer of FIG. 3 in accordance with an embodiment.

FIG. 7 is a cross-sectional side view of light spreading layer 42 showing how light leakage promotion structures 64 may be formed from recesses in the light spreading layer. As shown in FIG. 7, the recesses 64 may have a triangular cross-sectional shape. This example is merely illustrative, however. In general, the cross-section of recesses 64 may have any desired shape. Each recess (sometimes referred to as a groove) may extend along a longitudinal axis along the length of the light guiding layer, similar to the ridges shown in FIG. 5 (e.g., into or out of the page in FIG. 7, parallel to the Y-axis). Each recess may have a base width 96. The base width may be between 25 microns and 75 microns, between 20 microns and 100 microns, greater than 10 microns, greater than 30 microns, greater than 50 microns, greater than 80 microns, greater than 100 microns, greater than 1000 microns, less than 10 microns, less than 30 microns, less than 50 microns, less than 80 microns, less than 100 microns, less than 1000 microns, about (e.g., within 10% of) 50 microns, etc. Similarly, the recesses (sometimes referred to as prisms) may have any desired spacing 100. For example, distance 100 may be between 25 microns and 75 microns, between 20 microns and 100 microns, greater than 10 microns, greater than 30 microns, greater than 50 microns, greater than 80 microns, greater than 100 microns, greater than 1000 microns, less than 10 microns, less than 30 microns, less than 50 microns, less than 80 microns, less than 100 microns, less than 1000 microns, about 50 microns, etc. Moreover, light guiding layer 42 may have a planar surface that defines the recess and is at angle 98 relative to the X-axis. Angle 98 may be between 40 degrees and 50 degrees, between 15 degrees and 30 degrees, between 10 degrees and 50 degrees, more than 10 degrees, more than 20 degrees, more than 45 degrees, more than 65 degrees, less than 10 degrees, less than 20 degrees, less than 45 degrees, less than 65 degrees, about 20 degrees, about 45 degrees etc.

Recesses 64 in FIG. 7 may be filled with any desired material. In some cases, the recesses may be filled with air. In other embodiments, an optically clear adhesive or other transparent or opaque material may fill the recesses. The recesses may form a turning film surface that directs light in the positive Z-direction. The dimensions and spacing of each recess 64 may be the same across the light guiding layer or may vary across the light guiding layer.

Figure 8:
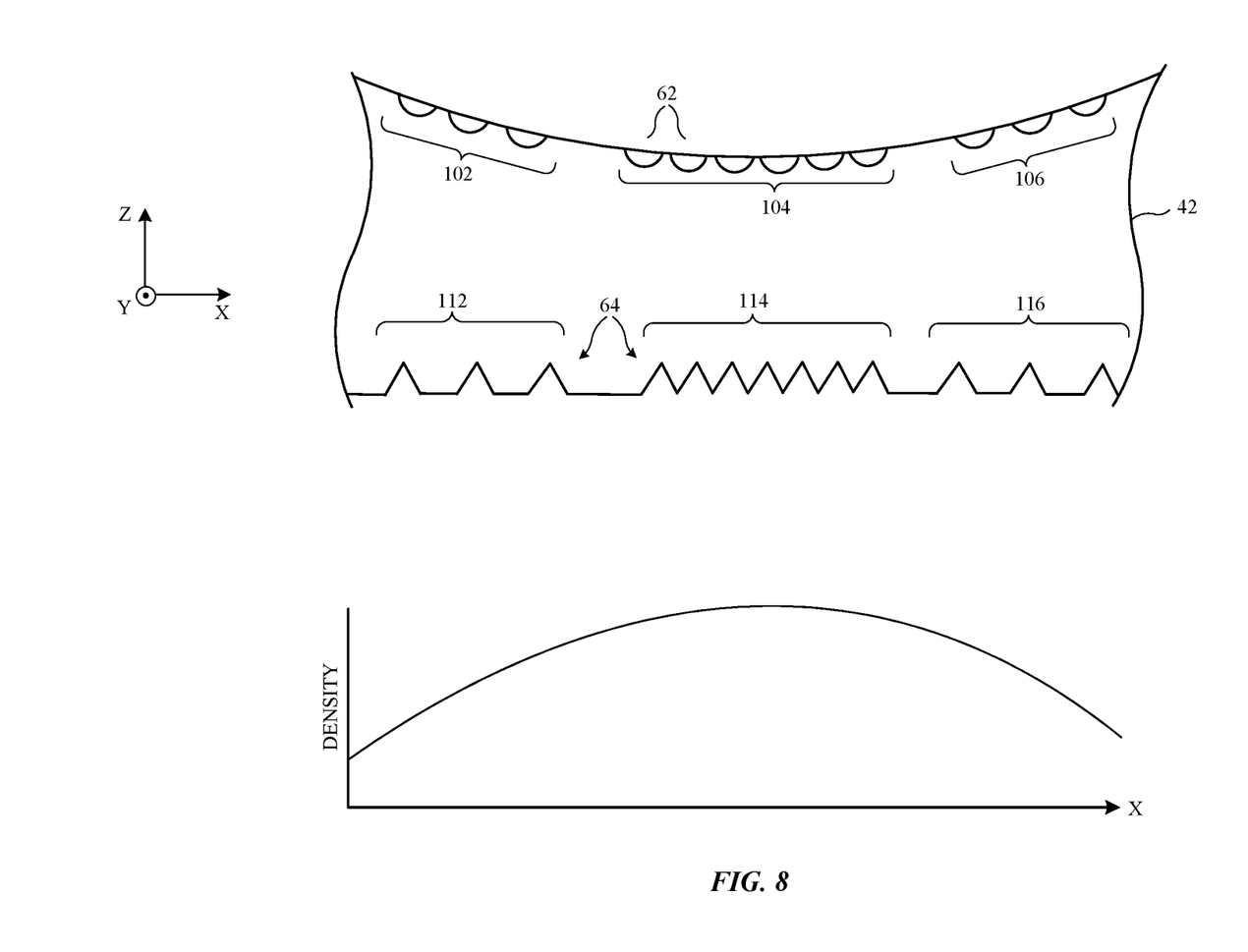
FIG. 8 is a cross-sectional side view of an illustrative light guiding layer having light leakage promotion structures with a varying density profile in accordance with an embodiment.

To further control how light is emitted from light guiding layer, light leakage promotion structures 62 and/or 64 may have a varied density across the light guiding layer. FIG. 8 is a cross-sectional side view of an illustrative light guiding layer that has light leakage promotion structures with varying density. As shown in FIG. 8, light leakage promotion structures 62 have a first region 102 with a first density (e.g., number of structures per unit of surface area of the light guiding layer), a second region 104 with a second density, and a third region 106 with a second density. The second density may be higher than the first and third densities. By having the higher density area in the center of the light guiding layer, it can be assured that light from the active area is distributed throughout the light guiding layer (and does not all exit the light guiding layer before reaching the center of the light guiding layer).

As shown in FIG. 8, light leakage promotion structures 64 have a first region 112 with a first density (e.g., number of recesses per unit of surface area of the light guiding layer), a second region 114 with a second density, and a third region 116 with a second density. The second density may be higher than the first and third densities. By having the higher density area in the center of the light guiding layer, it can be assured that light from the active area is distributed throughout the light guiding layer (and does not all exit the light guiding layer before reaching the center of the light guiding layer).

In general, both light leakage promotion structures 62 and 64 may have any desired density profile (with any number of regions each having any desired density). The density profile may change smoothly or step-wise between different densities. Structures 62 and 64 may have the same density profile or different density profiles.

Figure 9:
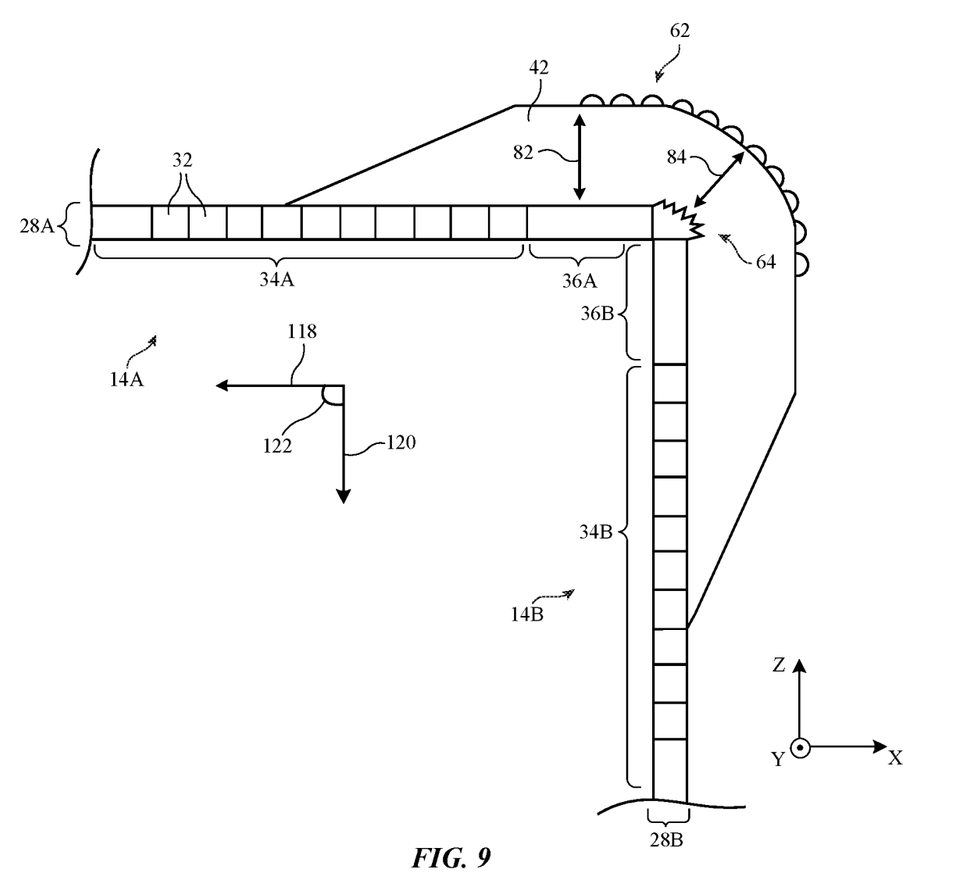
FIG. 9 is a cross-sectional side view of an illustrative electronic device having two adjacent displays at a 90-degree angle relative to each other and a light guiding layer to hide the border region between the two adjacent displays in accordance with an embodiment.

In the aforementioned embodiments, light guiding layer 42 is used to hide a border region between two adjacent and coplanar displays. This example is merely illustrative, however. Light guiding layer 42 may be used to hide a border region between two adjacent displays that are positioned at any angle relative to each other. FIG. 9 is a cross-sectional side view of illustrative displays that are positioned at an angle relative to each other. As shown in FIG. 9, display panel 28A extends along longitudinal axis 118, whereas display panel 28B extends along longitudinal axis 120. Axes 118 and 120 are separated by angle 122. In the embodiment of FIG. 9, angle 122 is 90 degrees. Axis 118 is parallel to the X-axis (and display panel 28A emits light in the positive Z-direction), whereas axis 120 is parallel to the Z-axis (and display panel 28B emits light in the positive X-direction).

Similar to as described in connection with FIG. 2, each display panel may have a corresponding inactive area (36A and 36B). The inactive areas 36A and 36B may collectively be referred to as a single inactive area, inactive region, or border region. As shown, light guiding layer 42 may overlap the active areas of displays 14A and 14B. A first portion of the light guiding layer overlaps (and is attached to) active area 34A of display panel 28A. A second portion of the light guiding layer overlaps (and is attached to) active area 34B of display panel 28B. A third portion of the light guiding layer (that is interposed between the first and second portions) overlaps (and is attached to) the inactive area 36A of display panel 28A and the inactive area 36B of display panel 28B. Light may enter light guiding layer 42 from active area 34A and active area 34B. Then, light leakage promotion structures may cause the light to exit the light guiding layer in the border region between the display active areas. This can ensure a seamless display surface with display light emitted across the entire display surface.

Light guiding layer 42 in FIG. 9 includes light leakage promotion structures 62 and 64 (as described above in connection with FIGS. 2-8). The dimensions, shapes, and density profiles of the light leakage promotion structures may be selected based on the angle 122 between the two displays (e.g., to optimize how light is emitted from the light guiding layer). FIG. 9 shows heights 82 and 84 of light guiding layer 42 (similar to as discussed in connection with FIG. 3). In FIG. 3, it was described how the center of the light guiding layer (e.g., height 84) may be thinned to promote light leakage. This example is merely illustrative, however. The ratio of height 84 to height 82 may be dependent upon angle 122 between the displays. As shown in FIG. 9, when angle 122 is 90 degrees, height 84 may be equal to height 82. Again, heights 82 and 84 may generally have any desired values.

The example in FIG. 9 of angle 122 being 90 degrees is merely illustrative. In general, angle 122 may be greater than 40 degrees, greater than 60 degrees, greater than 80 degrees, between 80 degrees and 100 degrees, between 40 degrees and 140 degrees, between 20 degrees and 160 degrees, greater than 100 degrees, greater than 120 degrees, 180 degrees (e.g., coplanar), less than 40 degrees, less than 60 degrees, less than 80 degrees, less than 100 degrees, less than 120 degrees, about (e.g., within 10% of) 90 degrees, or any other desired angle. Additionally, the example of FIG. 2 and FIG. 9 of light guiding layer 42 hiding a seam between two displays is merely illustrative. Light guiding layer 42 may hide a seam between any desired number of displays (e.g., two, three, more than three, etc.). The displays in FIG. 9 may also include the transparent filler material 54, transparent substrate 52-1, and/or transparent substrate 52-2 as described in connection with FIG. 2.

The foregoing is merely illustrative and various modifications can be made to the described embodiments. The foregoing embodiments may be implemented individually or in any combination.

What is claimed is:
1. An electronic device comprising:
a first display panel having a first active area;
a second display panel having a second active area, wherein the second display panel is adjacent to the first display panel; and
a light guiding layer that receives light from the first active area and the second active area, wherein the light guiding layer has an upper surface with a first portion that overlaps the first active area, wherein a first portion of the light passes through the first portion of the upper surface and exits the light guiding layer, and wherein a second portion of the light is reflected off the first portion of the upper surface to a region between the first and second active areas using total internal reflection.

2. The electronic device defined in claim 1, wherein the first display panel has a first inactive region, wherein the second display panel has a second inactive region, and wherein the first and second inactive regions are interposed between the first and second active areas.

3. The electronic device defined in claim 2, wherein the light guiding layer has a first portion that overlaps the first active area, a second portion that overlaps the second active area, and a third portion that is interposed between the first and second portions of the light guiding layer and that overlaps the first and second inactive regions.

4. The electronic device defined in claim 3, wherein the third portion of the light guiding layer has a center that is thinned relative to edges of the third portion of the light guiding layer.

5. The electronic device defined in claim 1, further comprising:
a transparent layer that is formed over the first display panel, the second display panel, and the light guiding layer.

6. The electronic device defined in claim 5, wherein the transparent layer is a polarizer.

7. The electronic device defined in claim 5, further comprising:
transparent filler that fills a gap between the first and second display panels and the transparent layer.

8. The electronic device defined in claim 1, further comprising:
a layer of adhesive that attaches the light guiding layer to the first and second display panels.

9. The electronic device defined in claim 1, wherein the first and second display panels are separated by an angle that is between 20 degrees and 160 degrees.

10. The electronic device defined in claim 9, wherein the angle is between 80 degrees and 100 degrees.

11. An electronic device comprising:
a first display panel having a first active area and a first inactive area;
a second display panel having a second active area and a second inactive area, wherein the first and second inactive areas are interposed between the first and second active areas; and
a light guiding layer that receives light from the first active area and the second active area, wherein the light guiding layer has a first portion that overlaps the first active area, a second portion that overlaps the second active area, and a third portion that is interposed between the first and second portions and that overlaps the first and second inactive areas, wherein the first and second portions transmit a first portion of the light and redirect a second portion of the light to the third portion using total internal reflection, wherein the third portion of the light guiding layer has an upper surface and a lower surface, wherein the light guiding layer includes light leakage promotion structures on the upper surface, and wherein the light guiding layer includes light redirecting structures on the lower surface.

12. The electronic device defined in claim 11, wherein the light leakage promotion structures comprise lenticular ridges that each extend along a respective longitudinal axis.

13. The electronic device defined in claim 11, wherein the light leakage promotion structures comprise an array of microlenses on the upper surface.

14. The electronic device defined in claim 11, wherein a first portion of the light leakage promotion structures has a first density and a second portion of the light leakage promotion structures has a second density that is different than the first density.

15. The electronic device defined in claim 11, wherein the light redirecting structures comprise recesses in the lower surface of the light guiding layer.

16. The electronic device defined in claim 11, wherein the light leakage promotion structures are formed on the upper surface in the third portion but not the first and second portions, and wherein the light redirecting structures are formed on the lower surface in the third portion but not the first and second portions.

17. An electronic device comprising:
a first display panel having a first active area;
a second display panel having a second active area, wherein the second display panel is adjacent to the first display panel; and
a light guiding layer having a first portion that receives light from the first active area and a second portion that receives light from the second active area, wherein the first portion has a first angled surface that redirects a first subset of the light from the first active area to a region between the first and second active areas using total internal reflection, wherein a second subset of the light from the first active area passes through the first angled surface, wherein the second portion has a second angled surface that redirects a first subset of the light from the second active area to the region between the first and second active areas using total internal reflection, and wherein a second subset of the light from the second active area passes through the second angled surface.

18. The electronic device defined in claim 17, wherein the light guiding layer comprises a third portion that is interposed between the first and second portions, wherein the third portion has an upper surface that is interposed between the first and second angled surfaces, wherein the third portion has a lower surface, and wherein the third portion of the light guiding layer has light leakage promotion structures on the upper surface and light redirecting structures on the lower surface.

* * * * *